United States Patent
Um

(10) Patent No.: US 10,209,593 B2
(45) Date of Patent: Feb. 19, 2019

(54) DISPLAY PANEL AND DISPLAY APPARATUS

(71) Applicant: BOE TECHNOLOGY GROUP CO., LTD., Beijing (CN)

(72) Inventor: Yoonsung Um, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 53 days.

(21) Appl. No.: 15/511,234

(22) PCT Filed: Jul. 1, 2016

(86) PCT No.: PCT/CN2016/088068
§ 371 (c)(1),
(2) Date: Mar. 14, 2017

(87) PCT Pub. No.: WO2017/156923
PCT Pub. Date: Sep. 21, 2017

(65) Prior Publication Data
US 2018/0157080 A1  Jun. 7, 2018

(30) Foreign Application Priority Data
Mar. 18, 2016 (CN) .......................... 2016 1 0158373

(51) Int. Cl.
*G02F 1/1368* (2006.01)
*G02F 1/1343* (2006.01)
(Continued)

(52) U.S. Cl.
CPC ........ *G02F 1/1368* (2013.01); *G02F 1/13624* (2013.01); *G02F 1/134336* (2013.01);
(Continued)

(58) Field of Classification Search
CPC .................................................. G02F 1/1368
See application file for complete search history.

(56) References Cited

U.S. PATENT DOCUMENTS

2002/0180920 A1* 12/2002 Noh ................. G02F 1/134363
349/141
2009/0009672 A1* 1/2009 Chung ............. G02F 1/134363
349/38
(Continued)

FOREIGN PATENT DOCUMENTS

CN 101561605 A 10/2009
CN 103242288 A 8/2013
(Continued)

OTHER PUBLICATIONS

First Chinese Office Action dated Oct. 17, 2017, for corresponding Chinese Application No. 201610158373.0.
(Continued)

*Primary Examiner* — Sang V Nguyen
(74) *Attorney, Agent, or Firm* — Kinney & Lange, P.A.

(57) ABSTRACT

The present disclosure provides a display panel and a display apparatus. The display panel includes a plurality of array units each including a first pixel array and a second pixel array, each of the first pixel array and the second pixel array has at least one domain tilting direction, and, one row of charging gate line and one row of common gate line are disposed between the first pixel arrays and the second pixel arrays of each row of the array units. A first transistor, a second transistor, a third transistor and an auxiliary liquid crystal capacitor are further disposed between the first pixel array and the second pixel array of each of the array units.

18 Claims, 2 Drawing Sheets

(51) Int. Cl.
   *G02F 1/1362* (2006.01)
   *H01L 27/12* (2006.01)
   *G02F 1/136* (2006.01)

(52) U.S. Cl.
   CPC .... *G02F 1/136286* (2013.01); *H01L 27/1255* (2013.01); *G02F 1/13439* (2013.01); *G02F 2001/13606* (2013.01); *G02F 2001/134345* (2013.01); *G02F 2201/122* (2013.01); *G02F 2201/123* (2013.01)

(56) References Cited

U.S. PATENT DOCUMENTS

| | | | | |
|---|---|---|---|---|
| 2009/0059110 | A1* | 3/2009 | Sasaki | G02F 1/134363 349/39 |
| 2009/0256979 | A1* | 10/2009 | Shin | G02F 1/133371 349/38 |
| 2012/0140153 | A1* | 6/2012 | Kawashima | G02F 1/133707 349/96 |
| 2012/0306731 | A1* | 12/2012 | Iyama | G02F 1/136213 345/87 |
| 2013/0083263 | A1 | 4/2013 | Kim et al. | |
| 2013/0208222 | A1* | 8/2013 | Song | C07D 333/16 349/123 |
| 2014/0285754 | A1* | 9/2014 | Lee | G02F 1/1337 349/106 |
| 2016/0291367 | A1* | 10/2016 | Cheng | G02F 1/1368 |

FOREIGN PATENT DOCUMENTS

| | | |
|---|---|---|
| CN | 104062810 A | 9/2014 |
| CN | 204065625 U | 12/2014 |
| CN | 104777638 A | 7/2015 |
| CN | 105572999 A | 5/2016 |

OTHER PUBLICATIONS

International Search Report and Written Opinion (including English translation of Box V) for corresponding PCT Application No. PCT/CN2016/088068, dated Nov. 28, 2016.

* cited by examiner

DISPLAY PANEL AND DISPLAY APPARATUS

CROSS-REFERENCE TO RELATED APPLICATION

This application claims the benefit of Chinese Patent Application No. 201610158373.0 filed on Mar. 18, 2016 in the State Intellectual Property Office of China, the whole disclosure of which is incorporated herein by reference.

BACKGROUND

1. Technical Field

Embodiments of the present invention relate to the field of display technology, and particularly to a display panel and a display apparatus.

2. Description of the Related Art

With development of science and technology, conventional signal domain liquid crystal display no longer meets requirements of people on the liquid crystal display, since the conventional signal domain liquid crystal display has drawbacks such as, low contrast, asymmetry of view angle, occurrence of color shift of a displayed picture in different view angles, etc.

SUMMARY

In an embodiment of the present invention, a display panel is provided. The display panel comprises a plurality of array units each comprising a first pixel array and a second pixel array, each of the first pixel array and the second pixel array having at least one domain tilting direction, and, one row of charging gate line and one row of common gate line being disposed between the first pixel arrays and the second pixel arrays of each row of the array units. A first transistor, a second transistor, a third transistor and an auxiliary liquid crystal capacitor are further disposed between the first pixel array and the second pixel array of each of the array units. A first electrode of the first transistor is connected to a first electrode of the second transistor, a second electrode of the first transistor is connected to the auxiliary liquid crystal capacitor, and a control electrode of the first transistor is connected to the common gate line. The first electrode of the second transistor is further connected to the first pixel array, a second electrode of the second transistor is connected to a data line, and a control electrode of the second transistor is connected to the charging gate line. A first electrode of the third transistor is connected to the second pixel array, a second electrode of the third transistor is connected to the data line, and a control electrode of the third transistor is connected to the charging gate line.

In some embodiments, each of the first pixel array and the second pixel array may comprise a pixel electrode disposed on a first substrate, a common electrode disposed on a second substrate, and a liquid crystal layer disposed between the pixel electrode and the common electrode.

In some embodiments, the pixel electrode may comprise a strip-shaped electrode, and, the common electrode may comprise a plate-shaped electrode. Each of the first pixel array and the second pixel array may comprise strip-shaped electrodes having two different tilting directions, and initial orientations of liquid crystal molecules in the liquid crystal layer may be vertical orientations.

In some embodiments, each of the first pixel array and the second pixel array may comprise four pixel areas, and, tilting directions of the strip-shaped electrodes which are located within two of the four pixel areas disposed on a diagonal line may be the same.

In some embodiments, tilting directions of the strip-shaped electrodes which are located within two of the four pixel areas adjacent to each other in a row direction may be provided symmetrically with respect to a column direction, and, tilting directions of the strip-shaped electrodes which are located within two of the four pixel areas adjacent to each other in the column direction may be provided symmetrically with respect to the row direction.

In some embodiments, a first counter electrode of the auxiliary liquid crystal capacitor may comprise a strip-shaped electrode, and, a second counter electrode of the auxiliary liquid crystal capacitor may comprise a plate-shaped electrode. Tilting direction of the strip-shaped electrode of the auxiliary liquid crystal capacitor and tilting direction of the strip-shaped electrode of the first pixel array may be the same; and, initial orientations of auxiliary liquid crystal molecules in an auxiliary liquid crystal layer that is disposed between the first counter electrode and the second counter electrode may be vertical orientations.

In some embodiments, the first counter electrode of the auxiliary liquid crystal capacitor may be disposed in the same layer as and is made of the same material as the pixel electrode of the first pixel array, and, the second counter electrode of the auxiliary liquid crystal capacitor may be disposed in the same layer as and is made of the same material as the common electrode of the first pixel array.

In some embodiments, a common electrode line that is electrically connected to the common electrode may be further provided on the second substrate.

In some embodiments, the first counter electrode of the auxiliary liquid crystal capacitor may be connected to the second electrode of the first transistor, and, the second counter electrode of the auxiliary liquid crystal capacitor may be connected to the common electrode line.

In another embodiment of the present invention, a display apparatus comprising the abovementioned display panel according to embodiments of the present invention is further provided.

DETAILED DESCRIPTION OF THE EMBODIMENTS

In order to provide a better understanding of technique solutions of the present disclosure, the present disclosure will be further described hereinafter in detail in conjunction with embodiments and with reference to the attached drawings.

Figure 1:
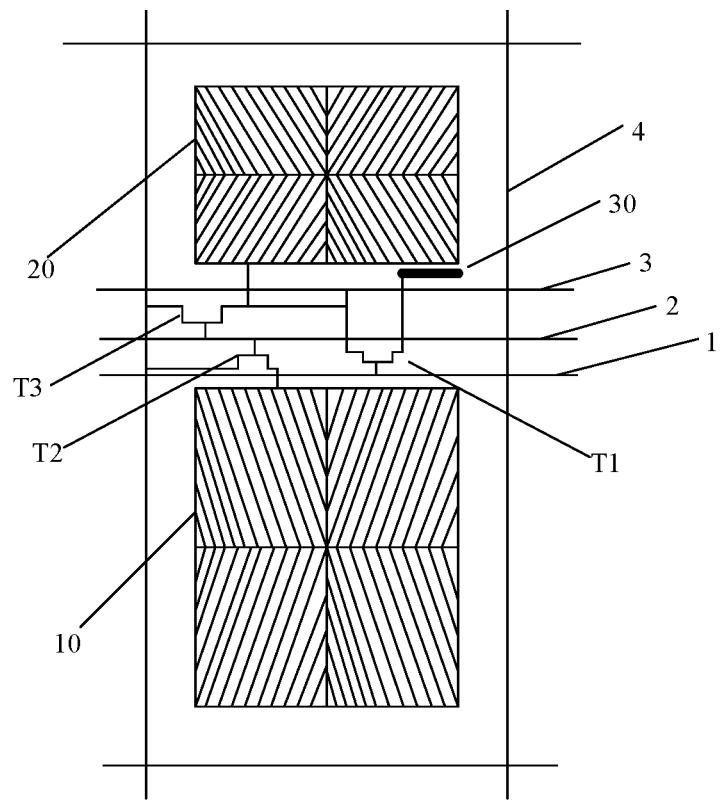
FIG. 1 is a structural schematic view of a conventional display panel.
Figure 2:
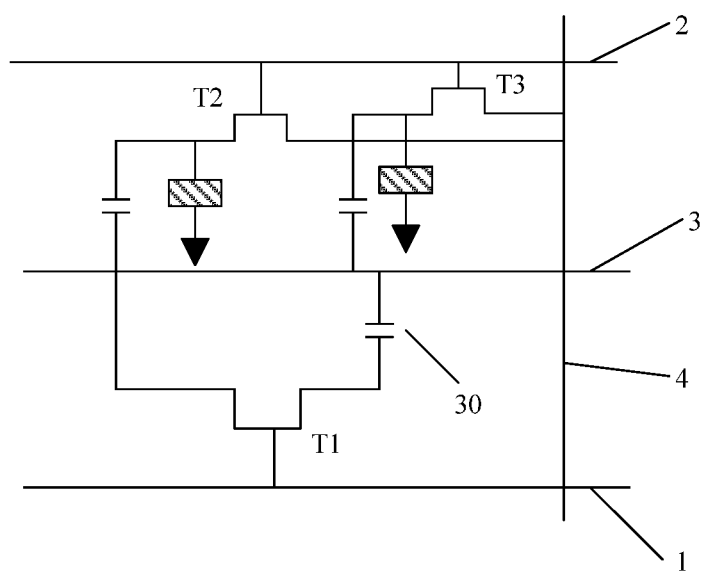
FIG. 2 is a circuit diagram of the display panel of FIG. 1.

FIGS. 1 and 2 show a pixel array with eight domain tilting directions. The pixel array comprises a plurality of array units. Each of the array units comprises a first pixel array 10 with low voltage and a second pixel array 20 with high voltage. Each of the first pixel array 10 and the second pixel array 20 comprises four pixel areas with different domain tilting directions. One row of charging gate line 2, one row of common gate line 1, one row of common electrode line 3, a first transistor T1, a second transistor T2, a third transistor T3, and a storage capacitor 30 necessary in the array unit are disposed between the first pixel array 10 and the second pixel array 20 of each of the array units.

However, the inventor has found that there exists at least the following problem in the abovementioned solution. Source electrodes and drain electrodes of the first transistor T1, second transistor T2 and third transistor T3 and a first counter electrode of the storage capacitor 30 are formed by using one patterning process, while a second counter electrode of the storage capacitor 30 and the gate electrodes of these transistors are formed by using one patterning process. Since a material for active layer is disposed between the first counter electrode and the second counter electrode of the storage capacitor 30, when the gate electrodes are electrically energized, current is generated between the first counter electrode and the second counter electrode of the storage capacitor 30, which causes value of the storage capacitor 30 to change, thereby affecting value of electric voltage at the first pixel array 10. As a result, an afterimage occurs in displaying.

Figure 3:
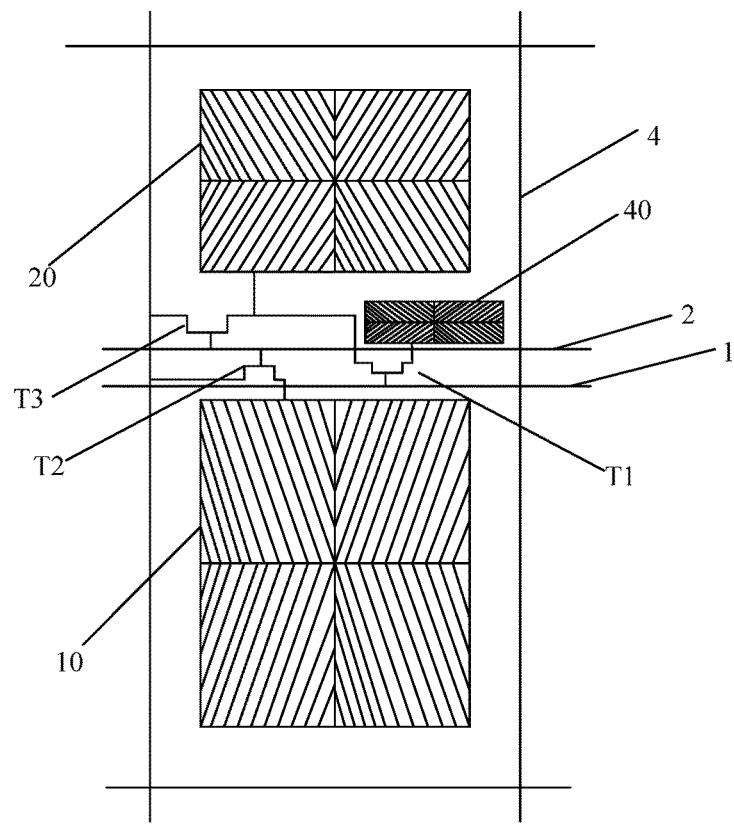
FIG. 3 is a structural schematic view of a display panel according to an embodiment of the present invention.
Figure 4:
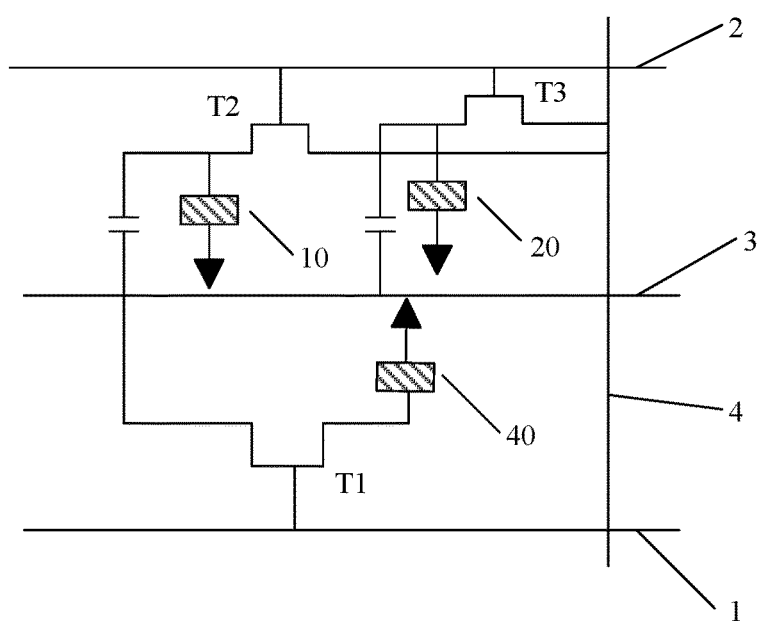
FIG. 4 is a circuit diagram of the display panel of FIG. 3.

Referring to FIG. 3 and FIG. 4, in an embodiment of the present invention, a display panel is provided. The display panel comprises a plurality of array units. Each of the array units comprises a first pixel array 10 and a second pixel array 20, and, each of the first pixel array 10 and the second pixel array 20 has at least one domain tilting direction. One row of charging gate line 2 and one row of common gate line 1 are disposed between the first pixel arrays 10 and the second pixel arrays 20 of each row of the array units. A first transistor T1, a second transistor T2, a third transistor T3 and an auxiliary liquid crystal capacitor 40 are also disposed between the first pixel array 10 and the second pixel array 20 of each of the array units. A first electrode of the first transistor T1 is connected to a first electrode of the second transistor T2, a second electrode of the first transistor T1 is connected to the auxiliary liquid crystal capacitor 40, and a control electrode of the first transistor T1 is connected to the common gate line 1. The first electrode of the second transistor T2 is further connected to the first pixel array 10, a second electrode of the second transistor T2 is connected to a data line 4, and a control electrode of the second transistor T2 is connected to the charging gate line 2. A first electrode of the third transistor T3 is connected to the second pixel array 20, a second electrode of the third transistor T3 is connected to the data line 4, and a control electrode of the third transistor T3 is connected to the charging gate line 2.

It should be noted that, herein, a domain denotes: a micro area where orientation vectors of liquid crystal molecules to which voltage is applied are substantially the same; a domain tilting direction denotes: a direction of orientation vectors of liquid crystal molecules to which voltage is applied within the domain. Factors which decide orientation vectors of liquid crystal molecules include size of electrical voltage and tilting direction of the strip-shaped electrode.

In the display panel, the first pixel array 10 is a pixel array with low voltage, and the second pixel array 20 is a pixel array with high voltage. Each of the first pixel array 10 and the second pixel array 20 comprises a pixel electrode and a common electrode (in FIG. 4, triangle is the common electrode disposed on the second substrate (assembling substrate/color film substrate). A first liquid crystal capacity is formed between the pixel electrode and the common electrode in the first pixel array 10, and a second liquid crystal capacity is formed between the pixel electrode and the common electrode in the second pixel array 20. In addition, one of the pixel electrode and the common electrode is the strip-shaped electrode. Hereinafter, an example in which the pixel electrode is a strip-shaped electrode and the common electrode is a plate-shaped electrode will be taken to illustrate and explain in the description, but it should not bring any limitations on this embodiment.

In prior art, one storage capacitor is necessarily provided in each of the array units, but, at least one of both counter electrodes of such storage capacitor is made of opaque metal material, that is to say, a position where the storage capacitor is located is an opaque region. However, in the display panel according to embodiments of the present invention, an auxiliary liquid crystal capacitor 40 is disposed between the first pixel array 10 and the second pixel array 20 of each of the array units. Storage capacitor that is necessarily provided in every array unit in prior art is replaced by the auxiliary liquid crystal capacitor 40. The auxiliary liquid crystal capacitor 40 does not affect aperture ratio of the array units (namely, area of the display region). Moreover, the auxiliary liquid crystal capacitor 40, just as its name implies, provided between its first counter electrode and second counter electrode is an auxiliary liquid crystal layer. Accordingly, the connection between the auxiliary liquid crystal capacitor 40 and the first pixel array 10 does not greatly affect electrical voltage applied on the first pixel array 10. As a result, no display afterimage problem will occur.

In an embodiment of the present invention, each of the first pixel array 10 and the second pixel array 20 comprises a pixel electrode, a common electrode and a liquid crystal layer disposed between the two. The pixel electrode may be disposed on a first substrate (namely an array substrate), and the common electrode may be disposed on a second substrate (namely an assembled substrate and a color film substrate).

The pixel electrode may be a strip-shaped electrode, and the common electrode may be a plate-shaped electrode. In addition, the strip-shaped electrodes in the first pixel array 10 have two different tilting directions, and the strip-shaped electrodes in the second pixel array 20 also have two different tilting directions. Meanwhile, initial orientations of liquid crystal molecules in the liquid crystal layer between the strip-shaped electrode and the plate-shaped electrode are vertical orientations.

Thus it can be seen, the strip-shaped electrodes in the first pixel array 10 of each of the array units have two tilting directions. Accordingly, when voltage is applied onto the strip-shaped electrode and the common electrode, liquid crystal molecules deflect, causing four areas where liquid crystal molecules are in different domain tilting directions, in other words, the first pixel array 10 comprises four pixel areas with different domain tilting directions. For same reason, the strip-shaped electrodes in the second pixel array 20 have two tilting directions, accordingly, the second pixel array 20 may comprise four pixel areas with different domain tilting directions. Meanwhile, because the voltage applied on the strip-shaped electrodes in the first pixel array 10 and the voltage applied on the strip-shaped electrodes in the second pixel array 20 are different in size (namely, the voltage applied on the strip-shaped electrodes in the first pixel array 10 is less than the voltage applied on the strip-shaped electrodes in the second pixel array 20), the four domain tilting directions in the first pixel array 10 and the four domain tilting directions in the second pixel array 20 are different. Thus, it should be understood that, each of the array units owns eight domain tilting directions. Hereinafter, such a display panel which owns the eight domain tilting directions is also named in short as an eight-domain display panel.

In some embodiments of the present invention, each of first pixel array 10 and the second pixel array 20 in each of the array units of the eight-domain display panel comprises four pixel areas, and, tilting directions of the strip-shaped electrodes which are located within two of the four pixel areas disposed on a diagonal line are the same. For example, referring to FIG. 3, tilting direction of the strip-shaped electrodes within an upper left pixel area of the first pixel array 10 is inclined along an extension line direction that is from the upper left to the lower right, and, tilting direction of the strip-shaped electrodes within a lower right pixel area is inclined along an extension line direction that is also from the upper left to the lower right. Moreover, tilting directions of the strip-shaped electrodes which are located within adjacent pixel areas in a row direction are provided symmetrically with respect to a column direction, and, tilting directions of the strip-shaped electrodes which are located within two of the pixel areas adjacent to each other in the column direction are provided symmetrically with respect to the row direction. In particular, the first pixel array 10 is also taken as an example. Tilting direction of the strip-shaped electrodes within the upper left pixel area of the first pixel array 10 is inclined along an extension line direction that is from the upper left to the lower right, and, tilting direction of the strip-shaped electrodes within an upper right pixel area is inclined along an extension line direction that is from the upper right to the lower left, and, tilting direction of the strip-shaped electrodes within a lower left pixel area is also inclined along an extension line direction that is from the upper right to the lower left. For same reason, tilting direction of the strip-shaped electrodes in the second pixel array 20 and tilting direction of the strip-shaped electrodes in the corresponding position in the first pixel array 10 are the same.

The reason for provision of this configuration is mainly because, there usually is certain rule on deflections of the liquid crystal molecules, and, this configuration allows the display panel to own a greater field of view and improves uniformity of the displaying and aperture ratio of the pixels.

In a display panel according to some embodiments of the present invention, domain tilting direction of the auxiliary liquid crystal capacitor 40 and domain tilting direction of the first pixel array 10 are the same. Specifically, a first counter electrode of the auxiliary liquid crystal capacitor 40 is a strip-shaped electrode, and, a second counter electrode of the auxiliary liquid crystal capacitor 40 is a plate-shaped electrode. Tilting direction of the strip-shaped electrode of the auxiliary liquid crystal capacitor 40 and tilting direction of the strip-shaped electrode of the first pixel array 10 are the same. In addition, initial orientations of auxiliary liquid crystal molecules in the auxiliary liquid crystal layer that is disposed between the first counter electrode and the second counter electrode are vertical orientations. Of course, it should be understood that, if the first pixel array 10 has four pixel areas, then the auxiliary liquid crystal capacitor 40 also has four pixel areas, and, tilting direction of the strip-shaped electrodes within the four pixel areas of the auxiliary liquid crystal capacitor 40 and tilting direction of the strip-shaped electrodes within the four pixel areas of the first pixel array 10 are the same. The reason for provision of this configuration is because, when an operating voltage is applied to the charging gate line 2, the second transistor T2 and the third transistor T3 are switched on, to charge the first pixel array 10 and the second pixel array 20. After that, an operating voltage is applied to the common gate line 1, the first transistor T1 is switched on, to charge the auxiliary liquid crystal capacitor 40. Then, even if signals at the auxiliary liquid crystal capacitor 40 and those at the first pixel array 10 are mixed with each other, due to the same domain tilting directions of the two, potential at the auxiliary liquid crystal capacitor 40 will not affect potential at the first pixel array 10, that is, no display afterimage problem will occur.

In some embodiments of the present invention, the first counter electrode of the auxiliary liquid crystal capacitor 40 is disposed in the same layer as and is made of the same material as the pixel electrode (the strip-shaped electrode), and, the second counter electrode of the auxiliary liquid crystal capacitor 40 is disposed in the same layer as and is made of the same material as the common electrode (the plate-shaped electrode). That is to say, the first counter electrode of the auxiliary liquid crystal capacitor 40 and the pixel electrode may be formed by using one patterning process, and, the second counter electrode of the auxiliary liquid crystal capacitor 40 and the common electrode may be formed by using one patterning process. Of course, liquid crystal molecules in the auxiliary liquid crystal layer and liquid crystal molecules in the liquid crystal layers of the first and second pixel arrays may be perfused simultaneously. As a result, no process steps will be added, and thereby increasing the yield and reducing the manufacturing cost.

In some embodiments of the present invention, besides that the common electrode is provided on the second substrate, a common electrode line 3 that is electrically connected to the common electrode and is for providing signal is further provided on the second substrate. The first counter electrode of the auxiliary liquid crystal capacitor 40 is connected to the second electrode of the first transistor T1, and, the second counter electrode of the auxiliary liquid crystal capacitor 40 is connected to the common electrode line 3. As a result, no common electrode line 3 is required to be provided on the first substrate, thereby increasing aperture ratio of the pixels In another embodiment of the present invention, a display apparatus comprising the abovementioned display panel is further provided. Therefore, the display apparatus according to embodiments of the present invention has increased aperture ratio and improved display effect.

The display apparatus according to embodiments of the present invention may be any products or components having a display function, for example, liquid crystal panel, electronic paper, mobile phone, tablet computer, TV, display, notebook computer, digital photo frame, navigating instrument, etc.

It should be understood that the abovementioned embodiments are merely exemplary and are used to illustrate principle of the present invention, but not to limit the present invention. Various changes and modifications can be made without departing from principle and spirit of the present invention, and these changes and modifications should be regarded as be included within the scope of the present invention.

What is claimed is:

1. A display panel, comprising a plurality of array units each comprising a first pixel array and a second pixel array, each of the first pixel array and the second pixel array having at least one domain tilting direction, and, one row of charging gate line and one row of common gate line being disposed between the first pixel arrays and the second pixel arrays of each row of the array units; wherein, a first transistor, a second transistor, a third transistor and an auxiliary liquid crystal capacitor are further disposed between the first pixel array and the second pixel array of each of the array units, wherein the auxiliary liquid crystal capacitor comprises a first counter electrode formed on a first substrate, a second counter electrode formed on a second substrate and an auxiliary liquid crystal layer therebetween;

a first electrode of the first transistor is connected to a first electrode of the second transistor, a second electrode of the first transistor is connected to the auxiliary liquid crystal capacitor, and a control electrode of the first transistor is connected to the common gate line;

the first electrode of the second transistor is further connected to the first pixel array, a second electrode of the second transistor is connected to a data line, and a control electrode of the second transistor is connected to the charging gate line; and a first electrode of the third transistor is connected to the second pixel array, a second electrode of the third transistor is connected to the data line, and a control electrode of the third transistor is connected to the charging gate line.

2. The display panel of claim 1, wherein, each of the first pixel array and the second pixel array comprises a pixel electrode disposed on the first substrate, a common electrode disposed on the second substrate, and a liquid crystal layer disposed between the pixel electrode and the common electrode.

3. The display panel of claim 2, wherein,
the pixel electrode comprises a strip-shaped electrode,
the common electrode comprises a plate-shaped electrode,
each of the first pixel array and the second pixel array comprises strip-shaped electrodes having two different tilting directions, and
initial orientations of liquid crystal molecules in the liquid crystal layer are vertical orientations.

4. The display panel of claim 3, wherein, each of the first pixel array and the second pixel array comprises four pixel areas, and, tilting directions of the strip-shaped electrodes which are located within two of the four pixel areas disposed on a diagonal line are the same.

5. The display panel of claim 4, wherein, tilting directions of the strip-shaped electrodes which are located within two of the four pixel areas adjacent to each other in a row direction are provided symmetrically with respect to a column direction, and, tilting directions of the strip-shaped electrodes which are located within two of the four pixel areas adjacent to each other in the column direction are provided symmetrically with respect to the row direction.

6. The display panel of claim 3, wherein,
the first counter electrode of the auxiliary liquid crystal capacitor comprises a strip-shaped electrode,
the second counter electrode of the auxiliary liquid crystal capacitor comprises a plate-shaped electrode;
a tilting direction of the strip-shaped electrode of the auxiliary liquid crystal capacitor and a tilting direction of the strip-shaped electrode of the first pixel array are the same; and
initial orientations of auxiliary liquid crystal molecules in an auxiliary liquid crystal layer that is disposed between the first counter electrode and the second counter electrode are vertical orientations.

7. The display panel of claim 6, wherein, the first counter electrode of the auxiliary liquid crystal capacitor is disposed in the same layer as and is made of the same material as the pixel electrode of the first pixel array, and, the second counter electrode of the auxiliary liquid crystal capacitor is disposed in the same layer as and is made of the same material as the common electrode of the first pixel array.

8. The display panel of claim 2, wherein, a common electrode line that is electrically connected to the common electrode is further provided on the second substrate.

9. The display panel of claim 8, wherein the first counter electrode of the auxiliary liquid crystal capacitor is connected to the second electrode of the first transistor, and, the second counter electrode of the auxiliary liquid crystal capacitor is connected to the common electrode line.

10. A display apparatus, comprising the display panel of claim 1.

11. A display apparatus, comprising the display panel of claim 2.

12. A display apparatus, comprising the display panel of claim 3.

13. A display apparatus, comprising the display panel of claim 4.

14. A display apparatus, comprising the display panel of claim 5.

15. A display apparatus, comprising the display panel of claim 6.

16. A display apparatus, comprising the display panel of claim 7.

17. A display apparatus, comprising the display panel of claim 8.

18. A display apparatus, comprising the display panel of claim 9.

* * * * *